(12) United States Patent
Gold

(10) Patent No.: US 9,704,694 B2
(45) Date of Patent: Jul. 11, 2017

(54) GAS COOLED PLASMA SPRAYING DEVICE

(71) Applicant: Rolls-Royce Corporation, Indianapolis, IN (US)

(72) Inventor: Matthew R. Gold, Carmel, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 0 days.

(21) Appl. No.: 14/794,570

(22) Filed: Jul. 8, 2015

(65) Prior Publication Data

US 2016/0013021 A1  Jan. 14, 2016

Related U.S. Application Data

(60) Provisional application No. 62/023,638, filed on Jul. 11, 2014, provisional application No. 62/082,441, filed on Nov. 20, 2014.

(51) Int. Cl.
| | | |
|---|---|---|
| *H01J 37/32* | (2006.01) | |
| *H05H 1/28* | (2006.01) | |
| *H05H 1/34* | (2006.01) | |
| *B05B 7/22* | (2006.01) | |
| *H05H 1/42* | (2006.01) | |

(52) U.S. Cl.
CPC .... *H01J 37/3244* (2013.01); *H01J 37/32018* (2013.01); *H01J 37/32568* (2013.01); *H05H 1/28* (2013.01); *H05H 1/34* (2013.01); *H05H 1/42* (2013.01); *H05H 2001/3463* (2013.01)

(58) Field of Classification Search
CPC .. H05H 1/28; H05H 1/34; H05H 1/42; H05H 2001/3436; H05H 2001/3447; H05H 2001/3457; H05H 2001/3463; H01J 37/32018; H01J 37/3244; H01J 37/32568; B05B 7/20; B05B 7/205; B05B 7/22; B05B 7/222; B05B 7/226
See application file for complete search history.

(56) References Cited

U.S. PATENT DOCUMENTS

| | | | |
|---|---|---|---|
| 3,803,380 A * | 4/1974 | Ragaller | B05B 7/226 219/121.47 |
| 3,839,618 A | 10/1974 | Muehlberger | |
| 4,121,082 A | 10/1978 | Harrington et al. | |
| 4,328,257 A | 5/1982 | Muehlberger et al. | |
| RE31,018 E | 8/1982 | Harrington et al. | |
| 4,670,290 A | 6/1987 | Itoh et al. | |
| 5,296,668 A * | 3/1994 | Foreman | H05H 1/28 219/119 |
| 5,408,066 A | 4/1995 | Trapani et al. | |
| 5,436,426 A | 7/1995 | Nerz et al. | |
| 5,519,183 A | 5/1996 | Mueller | |
| 5,726,415 A * | 3/1998 | Luo | B23K 10/00 219/121.48 |
| 6,897,402 B2 * | 5/2005 | Crawmer | H05H 1/34 219/121.47 |
| 7,605,340 B2 | 10/2009 | Duan | |
| 8,367,963 B2 | 2/2013 | Zajchowski et al. | |

* cited by examiner

*Primary Examiner* — Darren W Gorman
(74) *Attorney, Agent, or Firm* — Shumaker & Sieffert, P.A.

(57) ABSTRACT

A plasma spraying device may include a first electrode and a second electrode. The first electrode may define an ionizing gas channel and at least one cooling channel. A distal end of the at least one cooling gas channel opens to an exterior of the plasma spraying gun proximate to a distal end of the first electrode. The second electrode is at least partially disposed in the ionizing gas channel.

20 Claims, 2 Drawing Sheets

GAS COOLED PLASMA SPRAYING DEVICE

RELATED APPLICATIONS

This application claims the benefit of U.S. Provisional Application No. 62/023,638, titled, "GAS COOLED THERMAL SPRAYING DEVICE," filed Jul. 11, 2014, and U.S. Provisional Application No. 62/082,441, titled, "GAS COOLED PLASMA SPRAYING DEVICE," filed Nov. 20, 2014, the entire contents of which are incorporated herein by reference.

TECHNICAL FIELD

The present disclosure describes a device for use in plasma spraying.

BACKGROUND

Plasma spraying of powdered feedstocks has traditionally been performed using large plasma spray equipment with line of sight requirements. Because of the high energies associated with the plasma spray process, a closed water cooling loop has been used to cool plasma spray guns. For example, the closed water cooling loop may be defined in the anode of the plasma spray gun to maintain acceptable temperature conditions within the anode. If flow of cooling water through the cooling loop is reduced or ceases, or if the cooling water temperature is too high, the plasma spray gun may prematurely wear or fail.

SUMMARY

The disclosure describes a plasma spraying device, such as a plasma spray gun. The plasma spraying device may include a first electrode that defines an ionizing gas channel and at least one cooling gas channel. A second electrode may be at least partially disposed in the ionizing gas channel, such that an electric arc may be formed in the ionizing gas channel between the first electrode and the second electrode to ionize gas flowing through the ionizing gas channel. The resulting ionized gas may exit from near the distal end of the device at a predetermined angle. In some examples, the first electrode is an anode and the second electrode is a cathode.

The first electrode also may define at least one cooling gas channel. The at least one cooling gas channel may extend from near a proximal end of the plasma spraying device to near a distal end of the plasma spraying device. The at least one cooling gas channel may be fluidically coupled to a cooling gas source at the proximal end of the at least one cooling gas channel. The first electrode may define at least one cooling gas channel exit at the distal end of the at least one cooling gas channel, such that the at least one cooling gas channel is open to an exterior of the first electrode at the distal end of the at least one cooling gas channel. In this way, cooling gas flowing through the at least one cooling gas channel may exit the first electrode at the distal end of the at least one cooling gas channel, rather than flowing back through the first electrode and being recycled. In some examples, using a cooling gas and not recycling the cooling gas may reduce a size of the first electrode, as less volume may be consumed by the cooling system. This may allow the plasma spraying device to be smaller while still being adequately cooled.

In some examples, the disclosure describes a plasma spraying device including a first electrode and a second electrode. The first electrode may define an ionizing gas channel and at least one cooling channel. A distal end of the at least one cooling gas channel opens to an exterior of the plasma spraying spray gun proximate to a distal end of the first electrode. The second electrode is at least partially disposed in the ionizing gas channel.

In some examples, the disclosure describes a system including a plasma spraying device. The plasma spraying device may include a first electrode and a second electrode. The first electrode may define an ionizing gas channel and at least one cooling channel. A distal end of the at least one cooling gas channel opens to an exterior of the plasma spraying device proximate to a distal end of the first electrode. The second electrode is at least partially disposed in the ionizing gas channel. The system also may include a cooling gas source fluidically coupled to the at least one cooling gas channel at a proximal end of the at least one cooling gas channel.

In some examples, the disclosure describes a method including applying a voltage between a first electrode and a second electrode of a plasma spraying device to generate an electric arc between the first electrode and the second electrode, wherein the first electrode defines a ionizing gas channel and the second electrode is at least partially disposed in the ionizing gas channel. The method also may include flowing a fuel through the fuel channel, wherein the electric arc ignites the fuel. Additionally, the method may include flowing a cooling gas through at least one cooling gas channel defined by the first electrode, wherein the at least one cooling gas channel opens to an exterior of the plasma spraying device proximate to a distal end of the first electrode such that the cooling gas flows out of the first electrode through the open end of the at least one cooling gas channel.

The details of one or more examples are set forth in the accompanying drawings and the description below. Other features, objects, and advantages will be apparent from the description and drawings, and from the claims.

DETAILED DESCRIPTION

Figure 1:
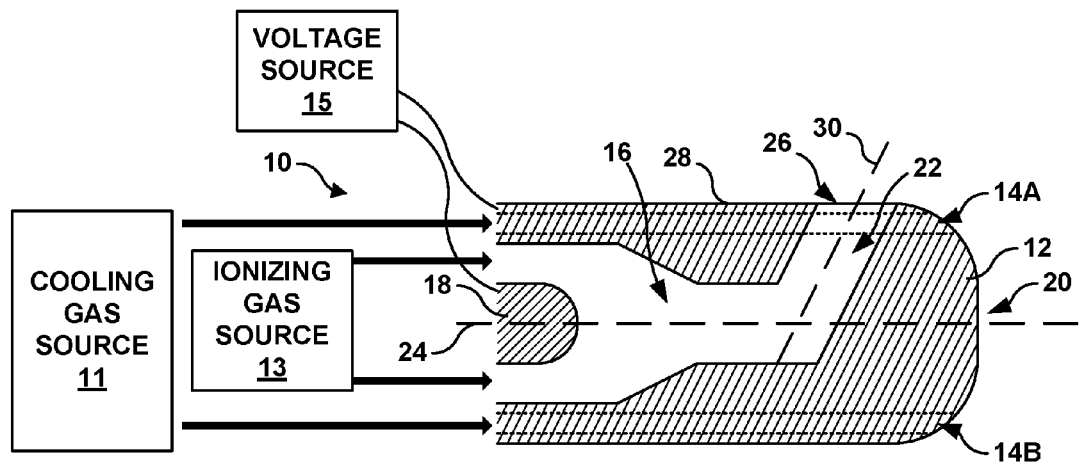
FIG. 1 is a conceptual and schematic cross-sectional diagram illustrating an example plasma spraying device including a first electrode defining at least one cooling gas channel.

The disclosure describes a plasma spraying device, such as a plasma spray gun. The plasma spraying device may include a first electrode that defines an ionizing gas channel and at least one cooling channel. A second electrode may be at least partially disposed in the ionizing gas channel, such that an electric arc may be formed in the ionizing gas channel to ionize an ionizing gas flowing through the ionizing gas channel to form an ionized gas which exits near the distal end of the cathode. In some examples, the first electrode is an anode and the second electrode is a cathode. The first electrode also may define at least one cooling gas channel. The at least one cooling gas channel may extend from near a proximal end of the plasma spraying device to near a distal end of the plasma spraying device. The at least one cooling gas channel may be fluidically coupled to a cooling gas source at the proximal end of the at least one cooling gas channel.

The first electrode may define at least one cooling gas channel exit at the distal end of the at least one cooling gas channel, such that the at least one cooling gas channel is open to an exterior of the first electrode at the distal end of the at least one cooling gas channel. In this way, cooling gas flowing through the at least one cooling gas channel may exit the first electrode at the distal end of the at least one cooling gas channel, rather than flowing back through the first electrode and being recycled.

In some examples, using a cooling gas and not recycling the cooling gas may reduce a size of the first electrode compared to a system utilizing water cooling, as less volume may be consumed by the cooling system. This may allow the plasma spraying device to be smaller while still being adequately cooled.

Some plasma spraying devices utilize closed water loops for cooling plasma spraying devices. Closed water loops for cooling plasma spraying device may occupy substantial volume within the plasma spraying devices. The passages carrying water to, through and from the plasma spraying device should be sufficiently large to allow sufficient water to flow through the passages; otherwise, the cooling capacity may be limited. The closed water loops also have passage geometries that facilitate the flow of the water without an overly large pressure drop. The size of the passages and passage geometries constrain the size of the plasma spraying device. Conversely, smaller plasma spraying devices utilizing closed water loops may be relatively low power due to the cooling constraints. For example, some smaller plasma spraying devices utilizing closed water loops may be restricted to lower kilowatts of power. A lower power may reduce the ability of the plasma spraying device to melt some materials used during the plasma spraying process.

Plasma spraying is a line of sight process. For example, plasma spraying may use a line of sight that is normal to the surface to which the coating is being applied. Deviation from a normal-to-the-surface application angle may affect the coating deposition and the properties of the coating. In some examples, a plasma spraying device that is too large does not allow the desired line of sight for geometrically constrained areas, such as internal cavities of relatively small components. This may lead to alternate coating techniques being used, which may add cost and complexity to the manufacturing process.

The present disclosure describes a plasma spraying device that includes a first electrode that defines at least one cooling gas channel. The at least one cooling gas channel may be coupled to a cooling gas source, rather than a cooling liquid source. The at least one cooling gas channel may be defined in the first electrode such that the end of the cooling gas channel is open to the exterior of the first electrode. Because a cooling gas is used rather than a liquid, the cooling gas may be expelled from the at least one cooling channel rather than being recycled back through the first electrode in a closed loop. A cooling gas may facilitate using smaller channels compared to using cooling water, and the lack of recycle channels may further reduce the volume occupied by the cooling system in the first electrode. Further, the cooling gas may be selected to be substantially inert to the coating materials and the substrate, such that the cooling gas may be expelled from the at least one cooling channel without substantially affecting the plasma spraying process. Together, these features may allow the plasma spraying device to be made smaller compared to a similarly powerful plasma spraying device that utilizes a closed water loop, which may allow the plasma spraying device to be used to coat components with complex geometry defining smaller volumes for the plasma spraying device to fit.

FIG. 1 is a conceptual and schematic cross-sectional diagram illustrating an example plasma spraying device 10 including a first electrode 12 defining at least one cooling gas channel 14. In the example illustrated in FIG. 1, first electrode 12 defines a first cooling gas channel 14A and a second cooling gas channel 14B (collectively, "cooling gas channels 14"). First electrode 12 also defines an ionizing gas channel 16. A second electrode 18 is at least partially disposed within ionizing gas channel 16.

First electrode 12 may be formed of an electrically conductive material, such as an electrically conductive metal or alloy. In some examples, first electrode 12 may be formed of copper or a copper alloy. In some examples, first electrode 12 is an anode.

Similarly, second electrode 18 may be formed of an electrically conductive material, such as an electrically conductive metal or alloy. In some examples, second electrode 18 may be formed of copper or a copper alloy. In some examples, second electrode 12 is a cathode.

A voltage source 15 may be electrically coupled to first electrode 12 and second electrode 18. Second electrode 18 may be substantially electrically isolated from first electrode 12, e.g., by an electrically insulating material and the space between second electrode 18 and first electrode 12. However, when a sufficiently large voltage difference is applied between first electrode 12 and second electrode 18, an electric current may arc between first electrode 12 and second electrode 18 and extend through ionizing gas channel 16. The arc may ionize a gas flowing through ionizing gas channel 16 to form a plasma. In some examples, plasma spraying device 10 may be configured to generate a plasma having a power between about 5 kilowatts and about 15 kilowatts.

Ionizing gas channel 16 may extend from a proximal end of plasma spraying device 10 to proximate to (or near) distal end 20 of plasma spraying device 10. Ionizing gas channel 16 includes an ionizing gas channel exit portion 22, which is oriented at an angle to major axis 24 of plasma spraying device 10. Ionizing gas channel exit portion 22 exits first electrode 12 at ionizing gas channel exit 26 defined in outer surface 28 of first electrode 12. Ionizing gas channel exit portion 22 may define an ionizing gas channel exit portion axis 30. In some examples, the angle between major axis 24 and ionizing gas channel exit portion axis 30 may be between about 20 degrees and about 90 degrees.

The proximal end of ionizing gas channel 16 may be fluidically coupled to an ionizing gas source 13. Ionizing gas source 13 may provide a gas that is ionized to form the plasma.

First electrode 12 also defines cooling gas channels 14. Cooling gas channels 14 extend within first electrode 12 from proximate to a proximal end of first electrode 12 (not shown in FIG. 1) to proximate to distal end 20 of first electrode 12. As shown in FIG. 1, in some examples, cooling gas channels 14 each extends substantially parallel to major axis 24 of first electrode 12. In other examples, cooling gas channels 14 may extend within first electrode 12 in other orientations (e.g., not substantially parallel to major axis 24 for at least a portion of cooling gas channels 14).

Plasma spraying device 10 illustrated in FIG. 1 includes two cooling gas channels 14. In other examples, plasma spraying device 10 may include a single cooling gas channel 14 or more than two cooling gas channels 14. The number of cooling gas channels 14 may be selected based on at least one of the cooling capacity desired for plasma spraying device 10, the cooling gas used, the size of first electrode 12, the size of the respective cooling gas channels 14, or the like.

The size (e.g., diameter) of cooling gas channels 14 may be selected based on the desired pressure drop for the cooling gas flowing through cooling gas channels 14 and the desired cooling capacity. For example, a higher cooling capacity may utilize a higher cooling gas flow rate, more cooling gas channels 14, or both.

Figure 2A:
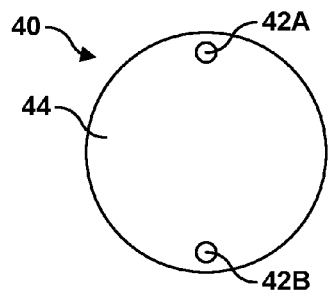
FIGS. 2A-2C are conceptual and schematic end view diagrams illustrating example plasma spraying devices including a first electrode defining at least one cooling gas channel.
Figure 2B:
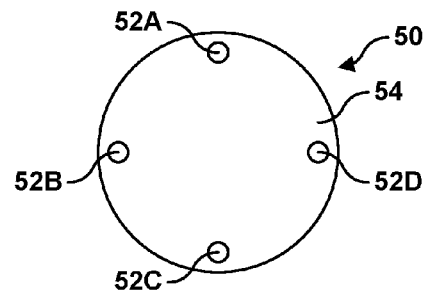

FIGS. 2A and 2B are conceptual and schematic end view diagrams illustrating example plasma spraying devices 40 and 50 including a first electrode defining at least one cooling gas channel 14. FIG. 2A illustrates a view of a distal end 44 of plasma spraying device 40 (e.g., a distal end of the first electrode of plasma spraying device 40). As shown in FIG. 2A, first cooling gas channel 42A opens to an exterior of plasma spraying device 40 (e.g., an exterior of the first electrode of plasma spraying device 40) at the distal end 44 of plasma spraying device 40. Similarly, second cooling gas channel 42B opens to the exterior of plasma spraying device 40 (e.g., an exterior of the first electrode of plasma spraying device 40) at the distal end 44 of plasma spraying device 40. By including cooling gas channels 42 that open to the exterior of plasma spraying device 40, the cooling gas flowing through cooling gas channels 42 may be expelled from the cooling gas channels 42 rather than being recycled back through the first electrode in a closed loop.

FIG. 2B illustrates a view of a distal end 54 of plasma spraying device 50 (e.g., a distal end of the first electrode of plasma spraying device 50). Instead of including two cooling gas channels 42A and 42B, plasma spraying device 50 includes four cooling gas channels 52A-52D. As shown in FIG. 2B, each of cooling gas channels 52A-52D opens to an exterior of plasma spraying device 50 (e.g., an exterior of the first electrode of plasma spraying device 50) at the distal end 54 of plasma spraying device 50.

Figure 2C:
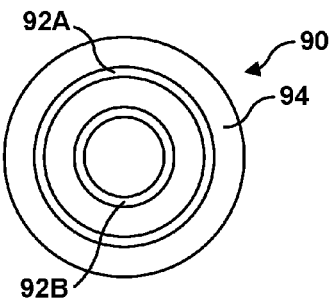

FIG. 2C illustrates a view of a distal end 94 of a plasma spraying device 90 (e.g., a distal end of the first electrode of plasma spraying device 90). Plasma spraying device 90 includes two concentric cooling gas channels 92A and 92B (collectively, "concentric cooling gas channels 92"). As shown in FIG. 2C, each of concentric cooling gas channels 92 opens to an exterior of plasma spraying device 90 (e.g., an exterior of the first electrode of plasma spraying device 90) at the distal end 94 of plasma spraying device 90. In the example of FIG. 2C, each of concentric cooling gas channels 92 extends in an annular channel substantially around a radial dimension of plasma spraying device 90. In other examples, at least one of concentric cooling gas channels 92 may extend less about less than the entire radial dimension of plasma spraying device 90, e.g., forming a crescent shape or arc in the view shown in FIG. 2C. Although FIG. 2C illustrates two concentric cooling gas channels 92A and 92B, in other examples, plasma spraying device 90 may include one cooling gas channel that extends in an channel around at least part of the radial dimension of plasma spraying device 90, or more than two cooling gas channels 92 that each extends in an channel around at least part of the radial dimension of plasma spraying device 90.

In some examples, rather than cooling gas channels 14, 42, 52, or 92 exiting the plasma spraying device 10, 40, 50, or 90 at the distal end 20, 44, 54, or 94 of the plasma spraying device 10, 40, 50, or 90, cooling gas channels 14, 42, 52, or 92 may exit the plasma spraying device 10, 40, 50, or 90 proximate to (or near) the distal end 20, 44, 54, or 94 of the plasma spraying device 10, 40, 50, or 90. For example, one or more cooling gas channel 14, 42, 52, or 92 may exit the plasma spraying device 10, 40, 50, or 90 at a circumferential surface of the plasma spraying device 10, 40, 50, or 90. Further, instead of including two or four cooling gas channels 14, 42, 52, or 92, plasma spraying device 10, 40, 50, or 90 may include other number of cooling gas channels 14, 42, 52, or 92.

Figure 3:
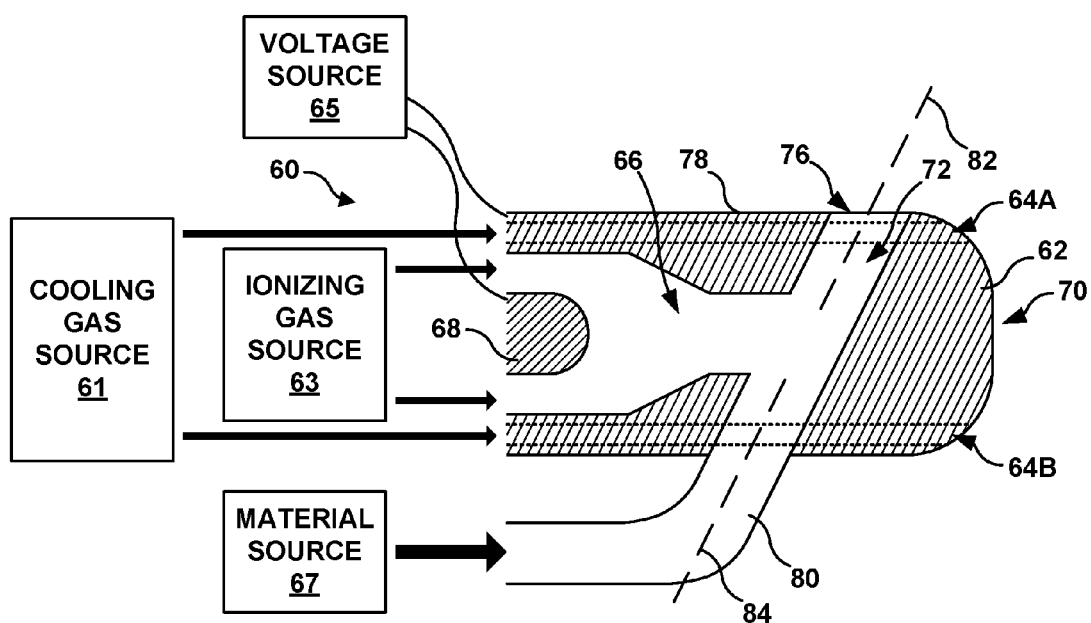
FIG. 3 is a conceptual and schematic cross-sectional diagram illustrating another example plasma spraying device including a first electrode defining at least one cooling gas channel.

FIG. 3 is a conceptual and schematic cross-sectional diagram illustrating another example plasma spraying device 60 including a first electrode 62 defining at least one cooling gas channel 64. Plasma spraying device 60 may be similar to or substantially the same as plasma spraying device 10 illustrated in FIG. 1, aside from the differences described herein. For example, similar to plasma spraying device 10, plasma spraying device 60 includes a first electrode 62 and a second electrode 68. First electrode 62 may be an anode, and second electrode 68 may be a cathode. First electrode 62 extends from a proximal end (not shown in FIG. 3) to a distal end 70 and defines an ionizing gas channel 66 and at first and second cooling gas channels 64A and 64B (collectively, "cooling gas channels 64").

Ionizing gas channel 66 includes an ionizing gas channel exit portion 72 exits first electrode 62 at ionizing gas channel exit 76 defined in outer surface 78 of first electrode 62. Unlike plasma spraying device 10, plasma spraying device 60 includes a material injection channel 80. Material injection channel 80 is separate from first electrode 62 until material injection channel 80 attached to outer surface 78 and fluidically couples to ionizing gas channel exit portion 72. Material injection channel 80 may fluidically connect to ionizing gas channel exit portion 72 downstream of the location at which the flame or plasma is formed, resulting in material being introduced into the flame or plasma. The proximal end of ionizing gas channel 66 may be fluidically coupled to an ionizing gas source 63. Ionizing gas source 63 may provide a gas that is ionized to form the plasma.

A proximal end of material injection channel 80 may be fluidically coupled to a material source directly or via an intermediate component, such as a tube, pipe, hose, or the like. The material source may be a source of material to be included in the coating formed using plasma spraying device 60. In some examples, the material may include at least one of a metal, an alloy, or a ceramic. In some examples, the material may be in a powder or particulate form, and may be delivered as a powder, e.g., carried by a gas. An axis 84 of material injection channel 80 may be substantially parallel with an ionizing gas channel exit portion axis 82.

In some examples, rather than material injection channel 80 being fluidically connect to ionizing gas channel exit portion 72, material injection channel 80 may be configured to introduce the material into the plasma flame externally of plasma spray device 60. For example, material injection channel 80 may be coupled to an external surface of the plasma spray device 60 and the exit of material injection channel 80 may be positioned such that material exiting from material injection channel 80 is introduced into the plasma flame.

In the examples of FIGS. 1 and 3, cooling gas channels 14A and 14B or 64A and 64B may be fluidically coupled to a cooling gas source 11 or 61 directly or via an intermediate component, such as a tube, pipe, hose, or the like. Cooling gas source 11 or 61 may provide a cooling gas under pressure such that the cooling gas flows through cooling gas channels 14A and 14B or 64A and 64B. In some examples, the cooling gas may substantially inert (e.g., nonreactive)

with the substrate on which the coating is being sprayed and the constituents of the coating, at the conditions at which the plasma spraying technique is being performed. Thus, the cooling gas may be expelled from cooling gas channels 14A and 14B or 64A and 64B without interfering with the plasma spraying technique, and need not be recycled through cooling gas channels in the first electrode 12 or 62.

In this way, the plasma spraying devices described herein may be coupled to a cooling gas source, rather than a cooling liquid source. Because a cooling gas is used rather than a cooling liquid, the cooling gas may be expelled from the at least one cooling channel rather than being recycled back through the first electrode in a closed loop. The cooling gas may facilitate using smaller channels compared to using cooling water, and the lack of recycle channels may further reduce the volume occupied by the cooling system in the first electrode. Further, the cooling gas may be selected to be substantially inert to the coating materials and the substrate, such that the cooling gas may be expelled from the at least one cooling channel without substantially affecting the plasma spraying process. Together, these features may allow the plasma spraying devices described herein to be made smaller compared to a similarly powerful plasma spraying device that utilizes a closed water loop, which may allow the plasma spraying device to be used to coat components with complex geometry defining smaller volumes for the plasma spraying device to fit.

Various examples have been described. These and other examples are within the scope of the following claims.

The invention claimed is:

1. A plasma spraying device comprising:
a first electrode defining:
an ionizing gas channel; and
at least one cooling gas channel, wherein a distal end of the at least one cooling gas channel opens to an exterior of the plasma spraying device proximate to a distal end of the first electrode, wherein the first electrode defines a respective exit from the plasma spraying device for each distal end of the at least one cooling gas channel; and
a second electrode disposed in the ionizing gas channel.

2. The plasma spraying device of claim 1, wherein the first electrode comprises copper.

3. The plasma spraying device of claim 1, wherein the ionizing gas channel exits the first electrode at an ionizing gas channel exit portion, wherein the ionizing gas channel exit portion defines an ionizing gas channel exit portion axis, wherein the first electrode defines a major axis, and wherein an angle between the ionizing gas channel exit portion axis and the major axis is between about 20 degrees and about 90 degrees.

4. The plasma spraying device of claim 1, wherein the at least one cooling gas channel comprises a plurality of cooling gas channels, and wherein each of the plurality of cooling gas channels includes a distal end open to an exterior of the plasma spraying device.

5. The plasma spraying device of claim 3, wherein the at least one cooling gas channel defines a cooling gas channel axis, and wherein the cooling gas channel axis is substantially parallel to the major axis.

6. The plasma spraying device of claim 1, further comprising a material injection channel coupled to an external surface of the device.

7. The plasma spraying device of claim 1, wherein the ionizing gas channel exits the first electrode at an ionizing gas channel exit portion, wherein the ionizing gas channel exit portion defines an ionizing gas channel exit portion axis, wherein the plasma spraying device further comprises a material injection channel connected to the first electrode, and wherein an axis of the material injection channel is substantially parallel with the ionizing gas channel exit portion axis.

8. A system comprising:
a plasma spraying device comprising:
a first electrode defining:
an ionizing gas channel; and
at least one cooling gas channel, wherein a distal end of the at least one cooling gas channel opens to an exterior of the plasma spraying device proximate to a distal end of the first electrode, wherein the first electrode defines a respective exit from the plasma spraying device for each distal end of the at least one cooling gas channel; and
a second electrode disposed in the ionizing gas channel; and
a cooling gas source fluidically coupled to the at least one cooling gas channel at a proximal end of the at least one cooling gas channel.

9. The system of claim 8, further comprising an ionizing gas source fluidically coupled to the ionizing gas channel.

10. The system of claim 8, further comprising a voltage source electrically coupled to the first electrode and the second electrode.

11. The system of claim 8, wherein the plasma spraying device further comprises a material injection channel coupled to an external surface of the device, the system further comprising a material source coupled to the material injection channel.

12. The system of claim 11, wherein the material source comprises a source of ceramic powder carried in a gas or a source of metal powder carried in a gas.

13. The system of claim 8, wherein the plasma spraying device is configured to generate a plasma between about 5 kilowatts and about 15 kilowatts.

14. The system of claim 8, wherein the first electrode comprises copper.

15. The system of claim 8, wherein the ionizing gas channel exits the first electrode at an ionizing gas channel exit portion, wherein the ionizing gas channel exit portion defines an ionizing gas channel exit portion axis, wherein the first electrode defines a major axis, and wherein an angle between the ionizing gas channel exit portion axis and the major axis is between about 20 degrees and about 90 degrees.

16. The system of claim 8, wherein the at least one cooling gas channel comprises a plurality of cooling gas channels, and wherein each of the plurality of cooling gas channels includes a distal end open to an exterior of the plasma spraying device.

17. The system of claim 15, wherein the at least one cooling gas channel defines a cooling gas channel axis, and wherein the cooling gas channel axis is substantially parallel to the major axis.

18. The system of claim 8, wherein the ionizing gas channel exits the first electrode at an ionizing gas channel exit portion, wherein the ionizing gas channel exit portion defines an ionizing gas channel exit portion axis, wherein the plasma spraying device further comprises a material injection channel connected to the first electrode, and wherein an axis of the material injection channel is substantially parallel with the ionizing gas channel exit portion axis, the system further comprising a material source coupled to the material injection channel.

19. A method comprising:
applying a voltage between a first electrode and a second electrode of a plasma spraying device to generate an electric arc between the first electrode and the second electrode, wherein the first electrode defines an ionizing gas channel and the second electrode is at least partially disposed in the ionizing gas channel;
flowing an ionizing gas through the ionizing gas channel, wherein the electric arc ionizes the gas; and
flowing a cooling gas through at least one cooling gas channel defined by the first electrode, wherein the at least one cooling gas channel opens to an exterior of the plasma spraying device proximate to a distal end of the first electrode such that the cooling gas flows out of the first electrode through the open end of the at least one cooling gas channel, wherein the first electrode defines a respective exit from the plasma spraying device for each distal end of the at least one cooling gas channel.

20. The method of claim 19, further comprising flowing a powder through a portion of the ionizing gas channel.

\* \* \* \* \*